US008604496B2

(12) United States Patent
Shioda et al.

(10) Patent No.: US 8,604,496 B2
(45) Date of Patent: Dec. 10, 2013

(54) OPTICAL SEMICONDUCTOR DEVICE

(75) Inventors: Tomonari Shioda, Kanagawa-ken (JP);
Hisashi Yoshida, Kanagawa-ken (JP);
Koichi Tachibana, Kanagawa-ken (JP);
Naoharu Sugiyama, Kanagawa-ken
(JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/214,690

(22) Filed: Aug. 22, 2011

(65) Prior Publication Data

US 2012/0132940 A1    May 31, 2012

(30) Foreign Application Priority Data

Nov. 26, 2010    (JP) ................................. 2010-263448

(51) Int. Cl.
*H01L 33/00* (2010.01)

(52) U.S. Cl.
USPC .......... 257/96; 257/19; 257/79; 257/E33.001; 257/E33.025

(58) Field of Classification Search
USPC ................. 257/19, 79, 96, E33.025, E33.001
See application file for complete search history.

(56) References Cited

U.S. PATENT DOCUMENTS

| 6,738,175 | B2 * | 5/2004 | Morita et al. | ................. 359/248 |
|---|---|---|---|---|
| 2003/0151044 | A1 * | 8/2003 | Yamada | ............................ 257/14 |
| 2004/0056258 | A1 * | 3/2004 | Tadatomo et al. | ............. 257/79 |
| 2007/0085083 | A1 * | 4/2007 | Erchak et al. | ................... 257/79 |
| 2009/0072262 | A1 * | 3/2009 | Iza et al. | ......................... 257/98 |

FOREIGN PATENT DOCUMENTS

| JP | 4-330794 | 11/1992 |
|---|---|---|
| JP | 2001-36134 | 2/2001 |
| JP | 2004-356256 A | 12/2004 |
| JP | 2008-252096 | 10/2008 |
| JP | 2009-259953 A | 11/2009 |

OTHER PUBLICATIONS

U.S. Appl. No. 13/404,531, filed Feb. 24, 2012, Kimura, et al.
U.S. Appl. No. 13/218,827, filed Aug. 26, 2011, Kimura, et al.
Japanese Office Action Issued Dec. 14, 2012 in Patent Application No. 2010-263448 (with English translation).
Japanese Office Action issued Jun. 12, 2013, in Japan Patent Application No. 2010-263448 (with English translation).

* cited by examiner

*Primary Examiner* — W. Wendy Kuo
*Assistant Examiner* — Moazzam Hossain
(74) *Attorney, Agent, or Firm* — Oblon, Spivak, McClelland, Maier & Neustadt, L.L.P.

(57) ABSTRACT

According to one embodiment, an optical semiconductor device includes an n-type semiconductor layer, a p-type semiconductor layer, and a functional part. The functional part is provided between the n-type semiconductor layer and the p-type semiconductor layers. The functional part includes a plurality of active layers stacked in a direction from the n-type semiconductor layer toward the p-type semiconductor layer. At least two of the active layers include a multilayer stacked body, an n-side barrier layer, a well layer and a p-side barrier layer. The multilayer stacked body includes a plurality of thick film layers and a plurality of thin film layers alternately stacked in the direction. The n-side barrier layer is provided between the multilayer stacked body and the p-type layer. The well layer is provided between the n-side barrier layer and the p-type layer. The p-side barrier layer is provided between the well layer and the p-type layer.

20 Claims, 5 Drawing Sheets

OPTICAL SEMICONDUCTOR DEVICE

CROSS-REFERENCE TO RELATED APPLICATIONS

This application is based upon and claims the benefit of priority from the prior Japanese Patent Application No. 2010-263448, filed on Nov. 26, 2010; the entire contents of which are incorporated herein by reference.

FIELD

Embodiments described herein relate generally to an optical semiconductor device.

BACKGROUND

A light emitting diode (LED) which is a semiconductor light emitting device using a nitride semiconductor is used, for example, for a display apparatus, a lightening apparatus or the like. A laser diode (LD) is used for a light source for reading/writing from/into a high density memory disc or the like. Further, a detector device using a nitride semiconductor has been considered.

For such optical semiconductor device, a higher efficiency is demanded.

DETAILED DESCRIPTION

In general, according to one embodiment, an optical semiconductor device includes an n-type semiconductor layer, a p-type semiconductor layer, and a functional part. The functional part is provided between the n-type semiconductor layer and the p-type semiconductor layer. The functional part includes a plurality of active layers stacked in a direction from the n-type semiconductor layer toward the p-type semiconductor layer. At least two of the active layers include a multilayer stacked body, an n-side barrier layer, a well layer and a p-side barrier layer. The multilayer stacked body includes a plurality of thick film layers and a plurality of thin film layers alternately stacked in the direction. A thickness of the thin film layers are not more than a thickness of the thick film layers. The n-side barrier layer is provided between the multilayer stacked body and the p-type semiconductor layer. The well layer is provided between the n-side barrier layer and the p-type semiconductor layer. The p-side barrier layer is provided between the well layer and the p-type semiconductor layer.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

Embodiment

An optical semiconductor device according to the embodiment is applied, for example, to a semiconductor light emitting device such as an LED and an LD. Further, the optical semiconductor device according to the embodiment is applied to a detector device. In the following, explanations will be given through the case of applying the optical semiconductor device according to the embodiment to a semiconductor light emitting device. Specifically, explanations will be given in the case where the optical semiconductor device according to the embodiment is an LED.

Figure 1A:
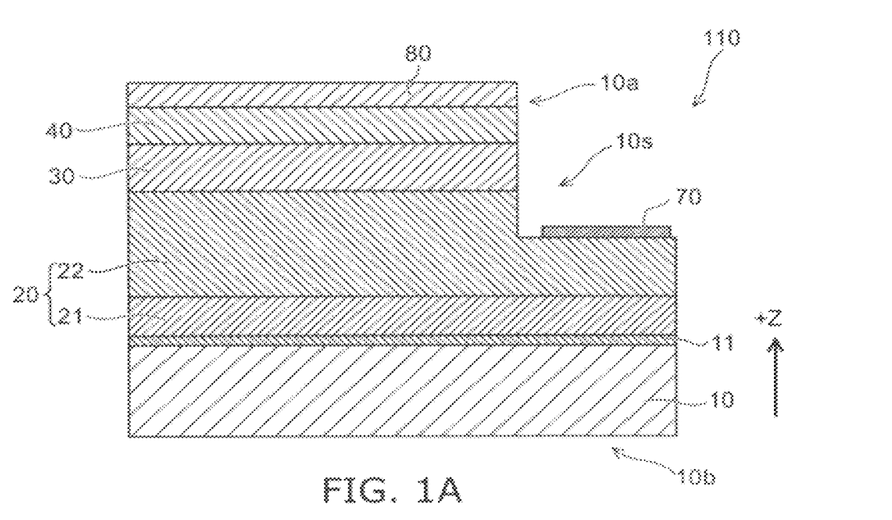
FIG. 1A and FIG. 1B are schematic cross-sectional views showing an optical semiconductor device according to an embodiment.
Figure 1B:
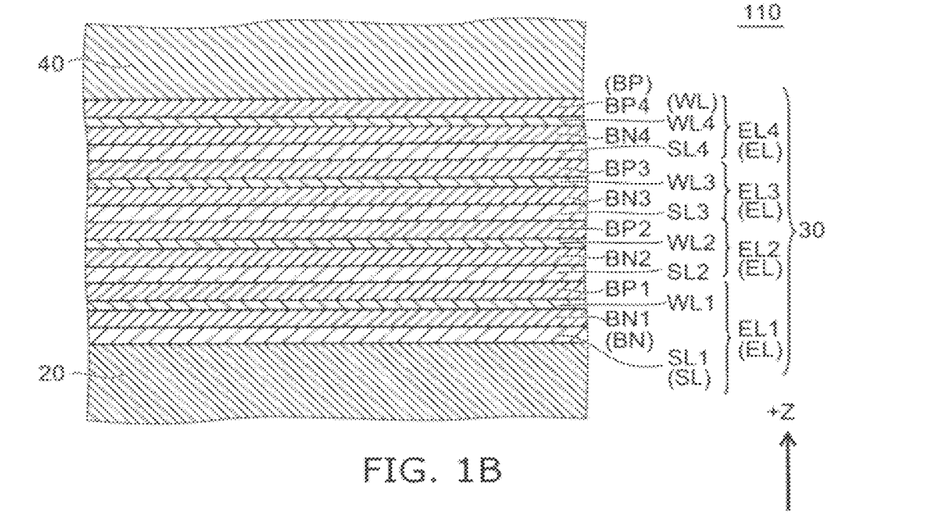

FIG. 1A and FIG. 1B are schematic cross-sectional views illustrating the configuration of an optical semiconductor device according to an embodiment.

Specifically, FIG. 1A shows an example configuration of the optical semiconductor device. FIG. 1B shows an example configuration of a part of the optical semiconductor device.

Figure 2:
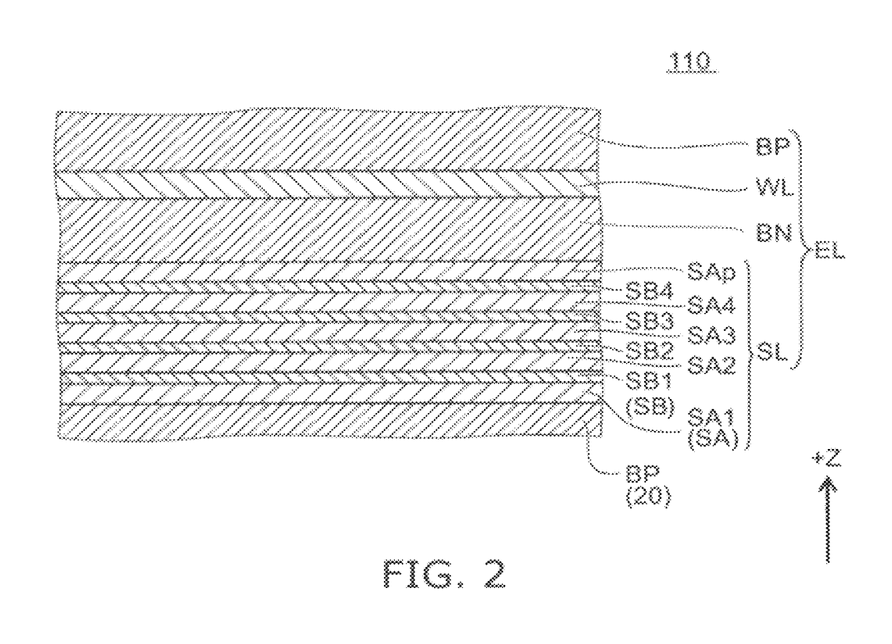
FIG. 2 is a schematic cross-sectional view showing a part of the optical semiconductor device according to the embodiment.

FIG. 2 is a schematic cross-sectional view illustrating the configuration of a part of the optical semiconductor device according to the embodiment.

As shown in FIG. 1A, an optical semiconductor device 110 according to the embodiment includes an n-type semiconductor layer 20, a p-type semiconductor layer 40 and a functional part 30.

The functional part 30 is provided between the n-type semiconductor layer 20 and the p-type semiconductor layer 40.

When adopting the semiconductor light emitting device for the optical semiconductor device 110, the functional part 30 serves as a light emitting part.

As shown in FIG. 1B, the functional part 30 includes a plurality of active layers EL stacked in a direction going from the n-type semiconductor layer 20 toward the p-type semiconductor layer 40 (for example, a first active layer EL1, a second active layer EL2, a third active layer EL3, a fourth active layer EL4 and the like). Namely, the plurality of active layers EL includes the first active layer EL1 to an n-th active layer ELn. Here, "n" is an integer of two or larger. When adopting the semiconductor light emitting device for the optical semiconductor device 110, the active layer EL serves as a light emitting layer.

In this Example, the number of the active layers EL is four. Namely, in this specific example, "n" is four. However, the embodiment is not limited to this, and the number of the active layers EL is two or larger, and may be any arbitrary number.

An (i+1)-th active layer EL(i+1) is provided between an i-th active layer ELi and the p-type semiconductor layer 40. Here, "i" is an integer of one or larger.

Each of at least two of the plurality of active layers EL includes a multilayer stacked body SL, an n-side barrier layer BN, a well layer WL and a p-side barrier layer BP.

In this example, each of the four active layers EL includes the multilayer stacked body SL, the n-side barrier layer BN, the well layer WL and the p-side barrier layer BP.

In each of these four active layers EL, the multilayer stacked body SL is provided between the n-type semiconductor layer 20 and the p-type semiconductor layer 40. The n-side barrier layer BN is provided between the multilayer stacked body SL and the p-type semiconductor layer 40. The well layer WL is provided between the n-side barrier layer BN and the p-type semiconductor layer 40. The p-side barrier layer BP is provided between the well layer WL and the p-type semiconductor layer 40.

Namely, in the first active layer EL1, a first multilayer stacked body SL1 is provided between the n-type semiconductor layer 20 and the p-type semiconductor layer 40. A first n-side barrier layer BN1 is provided between the first multilayer stacked body SL1 and the p-type semiconductor layer 40. The first well layer WL1 is provided between the first n-side barrier layer BN1 and the p-type semiconductor layer 40. The first p-side barrier layer BP1 is provided between the first well layer WL1 and the p-type semiconductor layer 40.

As described above, with a given arbitrary i (i is an integer of one or larger), in an i-th active layer ELi, an i-th multilayer stacked body SLi is provided between the n-type semiconductor layer 20 and the p-type semiconductor layer 40. An i-th n-side barrier layer BNi is provided between the i-th multilayer stacked body SLi and the p-type semiconductor layer 40. An i-th well layer WLi is provided between the i-th n-side barrier layer BNi and the p-type semiconductor layer 40. An i-th p-side barrier layer BPi is provided between the i-th well layer WLi and the p-type semiconductor layer 40.

Thus, in the functional part 30 of the optical semiconductor device 110, the plurality of active layers EL is provided. Namely, a plurality of the well layers WL is provided. Namely, the functional part 30 has a multiple quantum well (MQW) structure.

Here, the direction going from the n-type semiconductor layer 20 toward the p-type semiconductor layer 40 is assumed to be a Z-axis direction (stacking direction).

As shown in FIG. 2, each multilayer stacked body SL includes a plurality of thick film layers SA and a plurality of thin film layers SB that are alternately stacked in the Z-axis direction. The thin film layer SB has a thickness thinner than that of the thick film layer SA. The thin film layer SB has a different composition from that of the thick film layer SA. The film thickness of the thick film layer SA may be the same as the film thickness of the thin film layer SB, and even in that case, in the specification, the description will be made using the thick film layer and the thin film layer.

For example, the plurality of thin film layers SB includes the first thin film layer SB1 to the m-th thin film layer SBm. Here, "m" is an integer of two or larger. Here, an (i+1)-th thin film layer SB(i+1) is provided between an i-th thin film layer SBi and the p-type semiconductor layer 40.

The plurality of thick film layers SA includes a first thick film layer SA1 to an m-th thick film layer SAm. Here, the (i+1)-th thick film layer SA(i+1) is provided between the i-th thick film layer SAi and the p-type semiconductor layer 40. Moreover, the plurality of thick film layers SA may further include an (m+1)-th thick film layer SA(m+1). The (m+1)-th thick film layer SA(m+1) is the nearest layer to the p-type semiconductor layer 40 among the plurality of thick film layers SA. The (m+1)-th thick film layer SA(m+1) is the p-side thick film layer SAp.

The i-th thin film layer SBi is provided between the i-th thick film layer SAi and the (i+1)-th thick film layer SA(i+1).

In this specific example, "m" indicating the number of the thin film layers SB is four. The number of the thick film layers SA is m+1, i.e., 5. Here, the embodiment is not limited to this, and "m" is an arbitrary integer of two or larger.

The multilayer stacked body SL may have, for example, a superlattice structure.

The thickness of the thick film layer SA is set to 3 nanometers (nm) or less. More specifically, the thickness of the thick film layer SA is, for example, in a range of not less than 1.0 nm and not more than 3 nm. The thickness of the thin film layer SB is thinner than that of the thick film layer SA and thinner than 1.5 nm. Herewith, it is possible for the multilayer stacked body SL to have the superlattice structure.

The multilayer stacked body SL may include a nitride semiconductor.

Specifically, the thick film layer SA, for example, contains GaN. The thin film layer SB contains InGaN. For the thick film layer SB, for example, the GaN layer substantially without containing In is used. For the thin film layer SB, for example, an $In_{0.08}Ga_{0.92}N$ layer is used. The In concentration in the thin film layer SB is not limited to this, and an arbitrary concentration may be selected within the range where a desirable crystalline quality can be obtained.

For example, the bandgap energy in the bulk structure that has the composition of the thin film layer SB is thinner than that in the bulk structure that has the composition of the plurality of thick film layers SA.

As described above, in the optical semiconductor device 110 according to the embodiment, the functional part 30 has an MQW structure, and in each of the layers (active layers EL) included in the MQW, the multilayer stacked body SL is provided. Herewith, an optical semiconductor device of high efficiency can be obtained.

As will be described later, the optical semiconductor device 110 according to the embodiment is arranged such that the functional part 30 is formed on the n-type semiconductor layer 20, and the p-type semiconductor layer 40 is formed on the functional part 30. Additionally, when forming the functional part 30, the multilayer stacked body SL is formed, and the n-side barrier layer BN is formed on the multilayer stacked body SL. On the n-side barrier layer BN, the well layer WL is formed, and on this well layer WL, the p-side barrier layer BP is formed. In this manner, one active layer EL is formed. Then, the plurality of such active layers EL is stacked.

As described above, according to the embodiment, the multilayer stacked body SL is provided under the respective configuration of the n-side barrier layer BN/the well layer WL/the p-side barrier layer BP. Therefore, each of the plurality of well layers WL is grown by succeeding the morphology of the multilayer stacked body SL provided directly therebelow. Thus, the characteristics of the plurality of the well layers WL can be made uniform.

For example, a configuration may be considered in which the multilayer stacked body (superlattice layer) is formed on the n-type semiconductor layer 20, and the MQW without including the superlattice layer is formed on the multilayer stacked body. In this configuration, in the MQW, the morphology of the multilayer stacked body has a great effect on the well layer WL near the multilayer stacked body. On the other hand, the morphology of the multilayer stacked body has a small effect on the well layer WL near the p-type semiconductor layer 40.

In contrast, the embodiment is arranged such that the multilayer stacked body SL is provided directly below each of the plurality of the well layers WL. Therefore, the characteristics of the plurality of well layers WL can be adjusted, and made uniform, thereby improving a light emission efficiency. Namely, an optical semiconductor device of high efficiency and high luminance can be obtained.

In the embodiment, the thickness of the thick film layer SA is thinner than that of the n-side barrier layer BN and that of the p-side barrier layer BP. Specifically, the thickness of the n-side barrier layer BN and the thickness of the p-side barrier layer BP are thicker than 3 nm.

Herewith, in each of the well layers WL, a desirable effect of carrier confinement can be achieved by the n-side barrier layer BN and the p-side barrier layer BP. As a result, further improved light emission efficiency can be obtained. Namely, an optical semiconductor device of higher efficiency and higher luminance can be obtained.

The n-type semiconductor layer 20, the p-type semiconductor layer 40 and the functional part 30 include a nitride semiconductor.

Each of the well layer WL, the n-side barrier layer BN and the p-side barrier layer BP included in the active layer EL of the functional part 30 includes a nitride semiconductor.

The well layer WL contains, for example, InGaN. Further, the n-side barrier layer BN and the p-side barrier layer BP contain GaN. Namely, the concentration of the In contained in the well layer WL is higher than that of the In contained in the n-side barrier layer BN and the p-side barrier layer BP. Moreover, Al may be contained in at least parts of the n-side barrier layer BN and the p-side barrier layer BP.

Namely, the band gap energy of the well layer WL is smaller than that of the n-side barrier layer BN, and is smaller than that of the p-side barrier layer BP. Therefore, carriers can be effectively confined in the well layer WL.

For example, the well layer WL contains $In_xGa_{1-x}N$ ($0.12<x<1$). In this case, the peak wavelength of the light emitted from the functional part 30 is, for example, in a range of not less than 440 nm and not more than 650 nm. For example, the $In_{0.20}Ga_{0.80}N$ layer is used for the well layer WL. In this case, the peak wavelength of the light emitted from the functional part 30 is around 520 nm.

Additionally, the embodiment is not limited to this, and the peak wavelength is arbitrary as will be described later. Similarly, the In concentration in the well layer WL is arbitrary.

As shown in FIG. 1, for example, the n-type semiconductor layer 20 may include a foundation layer 21 and an n-side contact layer 22. The n-side contact layer 22 is provided between the foundation layer 21 and the functional part 30. For the foundation layer 21, for example, a GaN layer is used. For the n-side contact layer 22, a GaN layer including n-type impurities is used. For the n-type impurities, for example, Si (silicon) may be used.

For the p-type semiconductor layer 40, for example, a stacked layer of the p-type AlGaN layer (for example, functioning as an electron overflow blocking layer) and the p-type GaN layer may be used. The p-type GaN layer functions as a contact layer. For the p-type impurities, for example, Mg (magnesium) is used.

As described above, a stacked structure body 10s including the n-type semiconductor layer 20, the functional part 30 and the p-type semiconductor layer 40 is provided. In this specific example, a part on the side of a first major surface 10a of the stacked structure body 10s is selectively removed, so that the part of the n-type semiconductor layer 20 is exposed on the side of the first major surface 10a. In this exposed part, an n-side electrode 70 is provided. This n-side electrode 70 contacts the n-type semiconductor layer 20. The embodiment is not limited to this, and the n-side electrode 70 may be provided on the side of a second major surface 10b of the n-type semiconductor layer 20. For the n-side electrode 70, for example, a composite film of titanium, platinum and gold (Ti/Pt/Au) may be used.

A p-side electrode 80 contacts the p-type semiconductor layer 40. For the p-side electrode 80, for example, indium tin oxide (ITO), or the like may be used. Additionally, for the p-side electrode 80, a composite film of nickel and gold (Ni/Au) or the like may be used.

The optical semiconductor device 110 further includes a substrate 10 and a buffer layer 11. The substrate 10 and the buffer layer 11 may be provided as necessary and may be appropriately omitted.

For the substrate 10, for example, sapphire may be used. For example, a sapphire (0001) substrate may be used for the substrate 10. Other than the sapphire substrate, for example, a Si substrate, a SiC substrate or a GaN substrate may be used for the substrate 10. Furthermore, for the sapphire substrate, the substrate having other surface than (0001) may be used. On the substrate 10, the buffer layer 11 is formed. For the buffer layer 11, for example, a GaN layer may be used. On this buffer layer 11, the n-type semiconductor layer 20, the functional part 30 and the p-type semiconductor layer 40 are stacked sequentially. After the above-mentioned semiconductor layer is formed on the buffer layer 11, the substrate 10 may be removed.

Figure 3A:
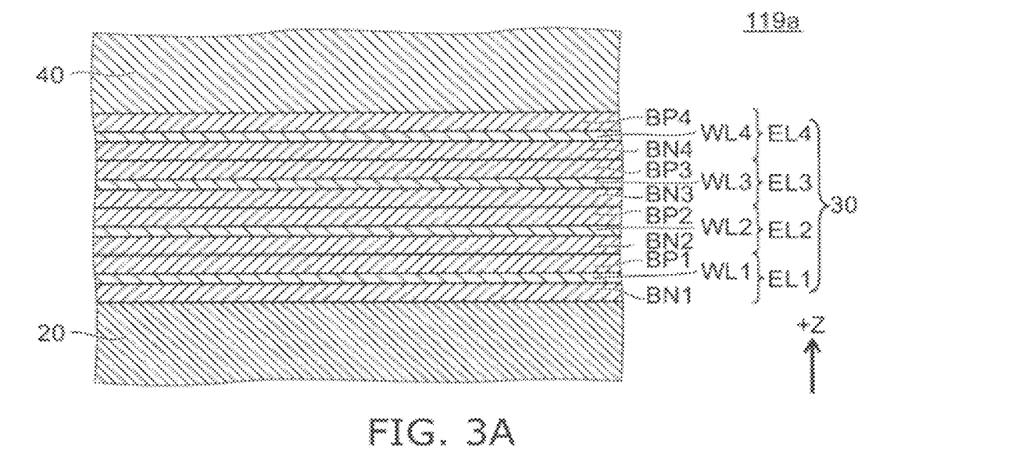
FIG. 3A and FIG. 3B are schematic cross-sectional views showing a semiconductor light emitting device according to a reference example.
Figure 3B:
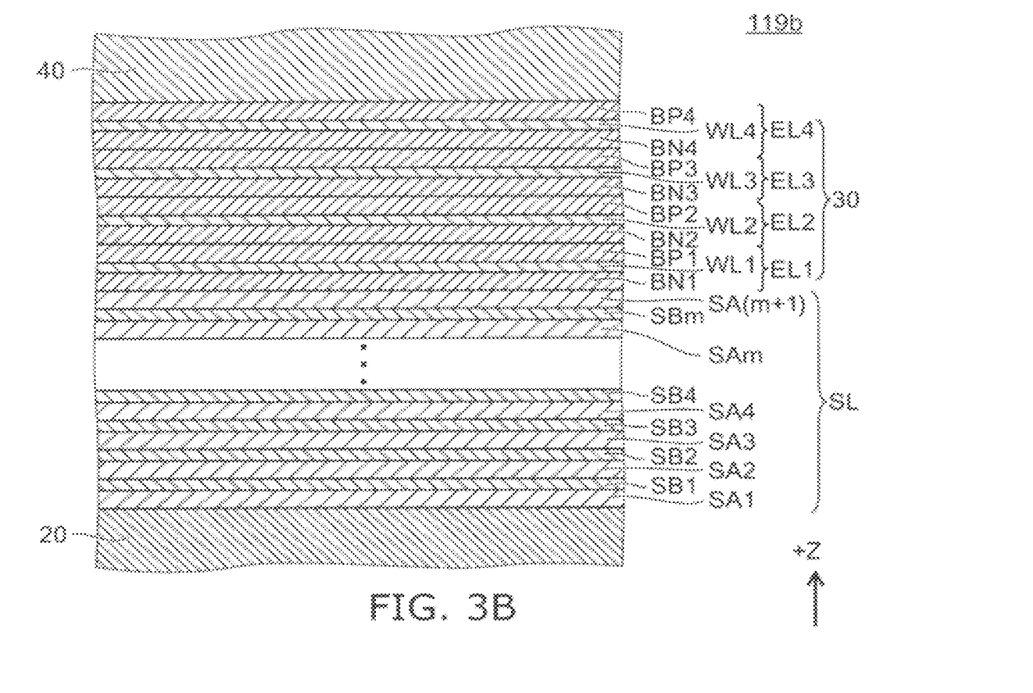

FIG. 3A and FIG. 3B are schematic cross-sectional views illustrating the configuration of a semiconductor light emitting device according to a reference example.

As shown in FIG. 3A, in an optical semiconductor device 119a according to a first reference example, a multilayer stacked body SL is not provided. Other than this, the optical semiconductor device 119a is similar to the optical semiconductor device 110, and the description thereof is omitted.

As shown in FIG. 3B, in the optical semiconductor device 119b according to a second reference example, the multilayer stacked body SL is not provided in each of the active layers EL. The multilayer stacked body SL is provided between the n-type semiconductor layer 20 and the functional part 30. Here, the number of the thin film layers SB in the multilayer stacked body SL is twenty. Namely, in the multilayer stacked body SL, the first thin film layer SB1 to the m-th thin film layer SBm, and the first thick film layer SA1 to the (m+1)-th thick film layer SA(m+1) are provided, wherein "m" is 20. Other than this, the optical semiconductor device 119b is similar to the optical semiconductor device 110, and the description thereof is omitted.

In the following, the characteristics of the optical semiconductor device 110, the optical semiconductor device 119a, and the optical semiconductor device 119b will be explained. First, the manufacturing conditions of the optical semiconductor device 110 will be explained.

First, a thermal cleaning of the substrate 10 of sapphire (0001) was performed using a susceptor temperature of 1100° C. Next, the susceptor temperature was decreased to 500° C., and a GaN layer to be formed into the buffer layer 11 was grown on the substrate 10. Next, after the susceptor temperature was increased to 1120° C., a GaN layer to be formed into the foundation layer 21 was grown. Further, the n-type impurity raw material was introduced, thereby forming the n-side contact layer 22.

Thereafter, the carrier gas was changed from $H_2$ into $N_2$, and the susceptor temperature was decreased to 810° C. Then, GaN layers with a thickness of 3 nm and $In_{0.08}Ga_{0.92}N$ layers with a thickness of 1 nm were formed alternately. The GaN layers serve as the thick film layers SA, and the $In_{0.08}Ga_{0.92}N$ layers serve as the thin film layers SB. The number of the GaN layers is five, and the number of the $In_{0.08}Ga_{0.92}N$ layers is four. As a result, the multilayer stacked body SL was formed.

Next, a GaN layer with a thickness of 4 nm was grown. This GaN layer serves as the n-side barrier layer BN. This GaN layer may contain Al and In to such extent that the crystalline quality is not deteriorated.

Next, an $In_{0.20}Ga_{0.80}N$ layer with a thickness of 3 nm was formed. This $In_{0.20}Ga_{0.80}N$ layer serves as the well layer WL. Further, a GaN layer with a thickness of 4 nm was formed. This GaN layer serves as the p-side barrier layer BP.

The growth of the above multilayer stacked body SL, the n-side barrier layer BN, the well layer WL and the p-side barrier layer BP corresponds to the formation of one active layer EL. The formation of the active layer EL was carried out in total of four periods. As a result, the functional part 30 was formed.

Thereafter, the p-type semiconductor layer 40 was formed on the functional part 30, thereby terminating the crystal growth process. Then, the n-side electrode 70 and the p-side electrode 80 were formed, and the optical semiconductor device 110 according to the embodiment was obtained.

On the other hand, for the optical semiconductor device 119a of the first reference example, after forming the n-type semiconductor layer 20, the growth of the n-side barrier layer BN, the well layer WL, and the p-side barrier layer BP was carried out for four periods without forming the multilayer stacked body SL. As a result, the functional part 30 was formed. Other than this, the optical semiconductor device 119a is the same as the optical semiconductor device 110.

For the optical semiconductor device according to the second reference example, the multilayer stacked body SL of 20 layers was formed after the formation of the n-type semiconductor layer 20. Namely, the GaN layers with a thickness of 3 nm and the $In_{0.08}Ga_{0.92}N$ layers with a thickness of 1 nm were formed alternately. This GaN layer serves as the thick film layer SA, and the $In_{0.08}Ga_{0.92}N$ layer serves as the thin film layer SB. The number of these GaN layers is twenty-one, and the number of $In_{0.08}Ga_{0.92}N$ layers is twenty. As a result, the multilayer stacked body SL was formed. Then, the growth of the n-side barrier layer BN, the well layer WL and the p-side barrier layer BP was carried out for four periods. As a result, the functional part 30 was formed. Other than this, the optical semiconductor device according to the second reference example is the same as the optical semiconductor device 110.

With respect to these optical semiconductor devices, photoluminescence measurements were performed.

Figure 4:
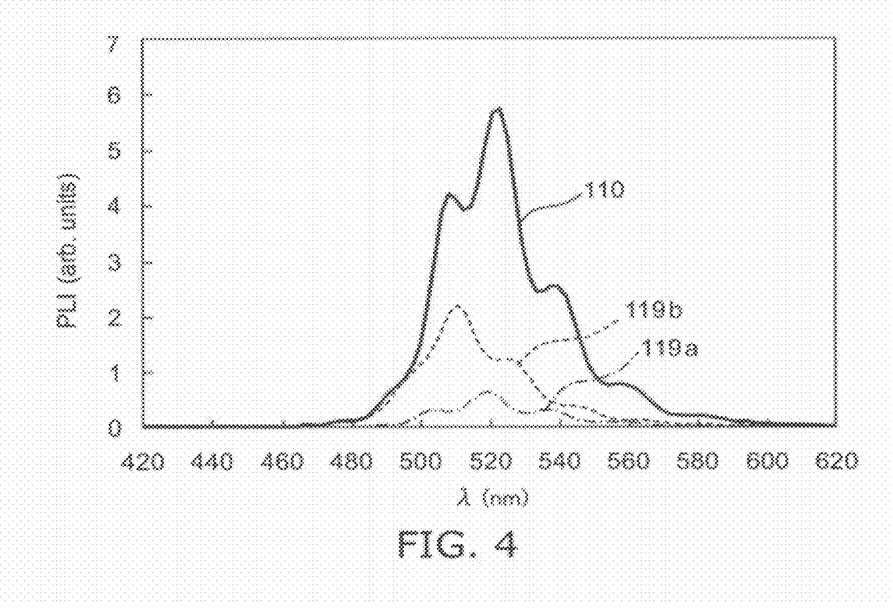
FIG. 4 is a graph showing characteristics of the optical semiconductor devices.

FIG. 4 is a graph illustrating characteristics of the optical semiconductor device.

Specifically, this figure shows results of photo-luminescence measurements of these optical semiconductor devices, in which the horizontal axis indicates a wavelength λ(nm), and the vertical axis indicates a photo-luminescence intensity PLI (relative value).

As shown in FIG. 4, in the case of the optical semiconductor device 119a according to the first reference example without the multilayer stacked body SL, the peak value of the photo-luminescence intensity PLI was 0.67, which was considerably low. In the case of the optical semiconductor device 119b of the second reference example, in which one multilayer stacked body SL was formed for 20 periods between the n-type semiconductor layer 20 and the functional part 30, the peak value of the photo-luminescence intensity PLI was 2.18, which was still low.

In contrast, in the case of the optical semiconductor device 110 according to the embodiment in which the multilayer stacked body SL of four periods was provided in each of the active layers EL, the peak value of photo-luminescence intensity PLI was 5.75. Namely, according to the optical semiconductor device 110, the light emission as high as 8.6 times of that of the first reference example and as high as 2.6 times of that of the second reference example was obtained.

As described above, according to the embodiment, the optical semiconductor device of high luminance can be obtained.

Further, in the case of the first reference example, the number of the thin film layers SB is twenty. In contrast, in the case of the optical semiconductor device 110 according to the embodiment, the number of the thin film layers SB is sixteen in total (four periods for one multilayer stacked body SL, and four periods for the active layer EL including the multilayer stacked body SL). As described above, according to the embodiment, high luminance can be realized despite of reducing the total number of layers of the thin film layers SB and the thick film layers SA.

As described above, according to the embodiment, an optical semiconductor device of high luminance can be realized despite of reducing the total number of layers and the total film thickness.

As described above, according to the embodiment, it is possible to provide an optical semiconductor device having high productivity and high efficiency.

The inventors made analyses on differences in characteristics of these optical semiconductor devices. For one of the analyses, light emission patterns on the surface of the semiconductor layer were observed using the fluorescence microscope. In this analysis, a sample (sample 119c) was evaluated as a reference in which the multilayer stacked body SL is formed without forming the barrier layer, the well layer and the p-type semiconductor layer.

FIG. 5A to FIG. 5D show fluorescence images of the optical semiconductor devices.

FIG. 5A to FIG. 5D correspond to the optical semiconductor device 110, the optical semiconductor device 119a, the optical semiconductor device 119b and the sample 119c respectively.

Figure 5A:
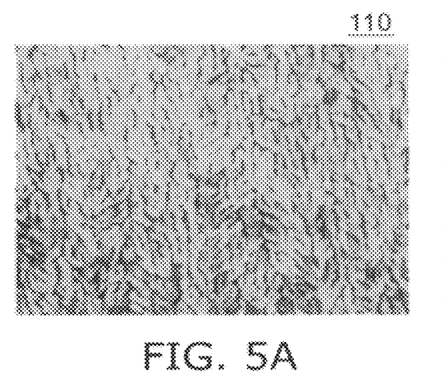
FIG. 5A to FIG. 5D show fluorescence images of the optical semiconductor devices.
Figure 5B:
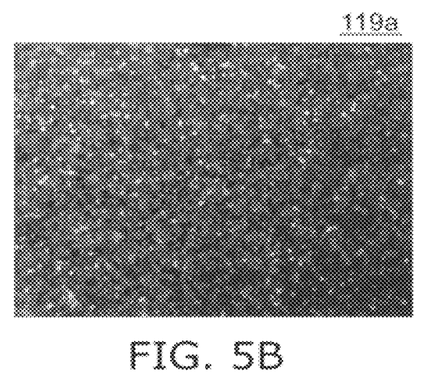
Figure 5C:
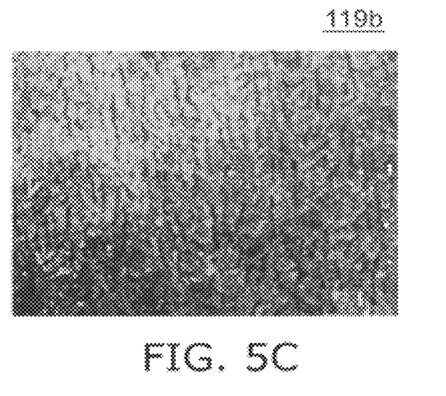
Figure 5D:
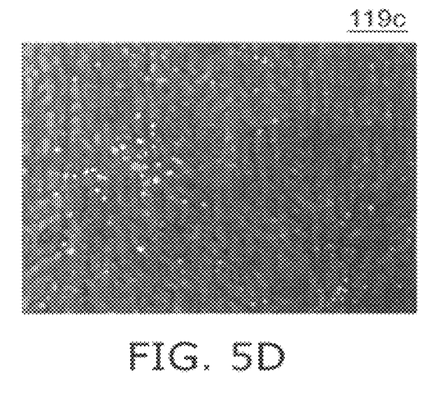

As shown in FIG. 5D, in the case of the sample 119c of only the multilayer stacked body SL, characteristic anisotropic patterns in the light emission of a fluorescence image were observed. These patterns correspond to the structure of a hexagonal crystal of the nitride semiconductor.

As shown in FIG. 5A, in the case of the optical semiconductor device 110 according to the embodiment, light-emission had anisotropic patterns. Namely, fluorescence images included bright portions and dark portions, and these portions were distributed in a form of veins having anisotropy. As described above, fluorescence images obtained by observing light emitted from the functional part 30 in a stacking direction had anisotropic patterns of light intensity. It is considered that these anisotropic patterns were affected by the multilayer stacked body SL provided in each of the active layers EL. Namely, according to the embodiment, since the multilayer stacked body SL was provided for each of the active layers EL, it is considered that crystals in the barrier layers and the well layers were strongly affected by the morphology of the multilayer stacked bodies SL. As a result, in the embodiment, the light emission of a fluorescence image had a strong anisotropy, and the anisotropic patterns were clearly observed.

As shown in FIG. 5B, in the case of the optical semiconductor device 119a according to the first reference example without the multilayer stacked body SL, isotropic light-emission patterns were observed. Namely, in this case, the light emission patterns did not reflect the crystal orientation.

As shown in FIG. 5C, in the case of the optical semiconductor device 119b according to the second reference example, in which one multilayer stacked body SL was provided, light emission patterns with weak anisotropy were observed. While the anisotropy of the light emission patterns was clearly observed for the sample 119c provided with only the multilayer stacked body SL illustrated in FIG. 5D, the anisotropy was reduced considerably by forming thereon the MQW. Based on this, it is considered that the anisotropy of crystal decreases as the crystal of the MQW grows, and becomes closer to isotropic.

On the other hand, in the case of the optical semiconductor device 110 according to the embodiment, one well structure is provided on each of the multilayer stacked bodies SL. In this case, the light emission patterns had high anisotropy.

It is considered that the morphology of the multilayer stacked body SL is disturbed by the growth of the MQW formed thereon, and morphology is less reflected as the number of the well layers increases. Therefore, it is considered, for example, that in the case of the optical semiconductor device 119b according to the second reference example, the crystal characteristics of the well layer WL near the multilayer stacked body SL differs from the crystal characteristics of the well layer WL near the p-type semiconductor layer 40. In the case of the optical semiconductor device 119b, it is considered that light emission patters differ among the MQW layers, and the light emission characteristics of the well layers WL are not made uniform among the layers in the MQW.

According to the embodiment, the multilayer stacked body SL is provided for each MQW. Thus, the characteristics of the plurality of well layers WL can be made uniform.

A strain is applied to the crystals in the well layer WL containing In while the functional part 30 is being grown. Here, it is considered that a large strain generates in the well layer WL provided on the top surface of the crystal being grown. However, it is considered that such strain is homogenized in the whole layers by further forming the GaN layer on this well layer WL.

In the case of the optical semiconductor device 119b according to the second reference example, it is considered that although a large strain is applied to the well layer WL near the multilayer stacked body SL, as the well layer WL is positioned more away from the multilayer stacked body SL, the strain of the multilayer stacked body SL becomes smaller. For example, the effect of the multilayer stacked body SL is difficult to be transferred to the well layer in the top layer.

In order to suppress the displacement caused by a difference between a lattice constant of the GaN layer in the foundation of the MQW structure and a lattice constant of the InGaN layer to be formed into the well layer of the MQW structure as in the case of the second reference example, it has been considered to insert a superlattice layer below the MQW structure. On the other hand, in order to obtain a high luminance and high efficiency light emission, it has been considered to increase the number of layers in the MQW structure. However, the effect from the superlattice would be reduced by increasing the number of layers in the MQW structure. Moreover, a difference in characteristics of the well layers WL among layers in the MQW structure would consequently result in that the efficiency cannot be improved sufficiently.

On the contrary, in the case of the optical semiconductor device 110 according to the embodiment, a strain is applied stably from each of the multilayer stacked bodies SL provided directly below each of the plurality of well layers WL. Namely, in each of the active layers EL, the strain of the crystal is adjusted, for example, by the multilayer stacked body SL. Then, the n-side barrier layer BN is formed on the multilayer stacked body SL, and the well layer WL is formed on the n-side barrier layer BN. Then, it is considered that the well layers WL can be formed coherent with the multilayer stacked body SL. This configuration is uniformly applied to the plurality of active layers EL.

As a reference example, the configuration in which at least either of the well layer and the barrier layer has a superlattice structure has been considered. In this case, near ultraviolet radiation of the wavelength range of 360 nm to 410 nm is emitted. In this case, the thickness of each of the layers included in the superlattice structure is set to 2 nm or less.

In contrast, according to the embodiment, the multilayer stacked body SL is provided in one active layer EL, and besides that the n-side barrier layer BN, the well layer WL, and the p-side barrier layer BP are provided. Namely, the respective functions of the layers are separated. It is therefore possible to optimize the design of each layer in the multilayer stacked bodies SL, the barrier layers and the well layers WL. Furthermore, it is possible to form these layers under the conditions optimized for the respective layers. As a result, high characteristics can be realized.

For the optical semiconductor device 110 according to the embodiment, for example, the barrier layers were grown at two temperature levels. Specifically, for example, a part of the layer of the n-side barrier layer BN is grown at high temperature (for example 850° C.), and the other part of the layer of the n-side barrier layer BN is grown at the low temperature (for example, 730° C.). Then, the well layer WL is grown at low temperature (for example, 730° C. growth). Further, a part of layer of the p-side barrier layer BP is grown at low temperature (for example, 730° C.), and other part of the p-side barrier layer BP is grown at high temperature (for example, 850° C.).

Namely, the embodiment includes a manufacturing method of the optical semiconductor device including an n-type semiconductor layer; a p-type semiconductor layer; and a functional part provided between the n-type semiconductor layer and the p-type semiconductor layer. The functional part includes a plurality of active layers stacked in a direction going from the n-type semiconductor layer toward the p-type semiconductor layer. At least two of the plurality of active layers includes a multilayer stacked body including a plurality of thick film layers and a plurality of thin film layers that are alternately provided in the direction, the thin film layer being thinner than the thick film layer; an n-side barrier layer provided between the multilayer stacked body and the p-type semiconductor layer; a well layer provided between the n-side barrier layer and the p-type semiconductor layer; and a p-side barrier layer provided between the well layer and the p-type semiconductor layer.

The manufacturing method includes forming a part of the n-side barrier layer on the multilayer stacked body at the first temperature, forming another part of the n-side barrier layer on the first part at the second temperature lower than the first temperature, and forming the well layer on the second part at the third temperature lower than the first temperature.

The manufacturing method further includes forming a part of the p-side barrier layer on the well layer at the fourth temperature lower than the first temperature, and forming another part of the p-side barrier layer on the third part at the fifth temperature higher than the fourth temperature.

For example, the first temperature is 850° C., the second temperature is 730° C., the third temperature is 730° C., the fourth temperature is 730° C., and the fifth temperature is 850° C. Namely, the second temperature is at least 50° C. lower than the first temperature. The fifth temperature is at least 50° C. higher than the fourth temperature. As described above, according the manufacturing method, the barrier layers are formed at two temperature levels. Additionally, it is preferable that the second temperature, the third temperature and the fourth temperature are substantially at the same temperatures. In this way, the time required for changing temperatures can be omitted, thereby achieving an improved productivity.

According to the foregoing method, in each of the plurality of active layers EL, when growing crystals, only a compressive strain is applied beforehand to the surfaces of the crystals. With this method, the lattice is partially alleviated while suppressing the deterioration in flatness of the crystal surface to the minimum, thereby substantially reducing the difference in lattice constant between the barrier layer and the well layer WL. As a result, the well layer WL of a high crystalline quality can be obtained.

In the embodiment, it is preferable that the multilayer stacked body SL and the n-side barrier layer BN contact each other, the n-side barrier layer BN and the well layer WL contact each other, and the well layer WL and the p-side barrier layer BP contact each other. Namely, it is preferable that in each of the plurality of active layers EL, the n-side barrier layer BN contacts the multilayer stacked body SL, the well layer WL contacts the n-side barrier layer BN, and the p-side barrier layer BP contacts the well layer WL. By making these layers mutually contact, the morphology of the multilayer stacked body can be effectively transferred, for example, to the well layers WL. However, the embodiment is not limited to this, and a layer which does not substantially reduce the transfer of the morphology may be inserted therebetween.

In the case of the optical semiconductor device 119b, in which one multilayer stacked body SL is provided between the n-type semiconductor layer 20 and the functional part 30, the respective numbers of the thick film layers SA and the thin film layers SB in the multilayer stacked body SL are generally set, for example, to ten to thirty.

In contrast, in the case of the embodiment in which the multilayer stacked body SL is provided for each of the active layers EL, the respective numbers of the thick film layers SA and thin film layers SB in the multilayer stacked body SL may be reduced. For example, the respective numbers of the thick film layers SA and the thin film layers in the multilayer stacked body SL are not less than two and not larger than ten.

It is preferable that the number of thin film layers SB is not less than four. Herewith, it is possible to stabilize the structure of the multilayer stacked body SL, and to stabilize the surface morphology of the multilayer stacked body SL with ease. As a result, high light emission efficiency is obtained.

It is preferable that the number of the plurality of active layers EL be three or larger. Herewith, it is possible to obtain high light emission efficiency with ease.

In the embodiment, it is not necessary to provide the multilayer stacked bodies SL for all of the plurality of active layers EL. Namely, it may be arranged, for example, such that pairs of the barrier layer and the well layer are formed in such number that the morphology of the multilayer stacked body SL can be substantially transferred. In this case, the multilayer stacked bodies SL provided in between may be omitted. For example, in the case where four active layers EL are provided, the multilayer stacked bodies SL may be provided respectively for the first active layer EL1 (on the side close to the n-type semiconductor layer 20) and the third active layer EL3, and the multilayer stacked body SL is not provided for the second active layer EL2 and the fourth active layer EL4.

However, it is more preferable that all of the plurality of active layers EL include the multilayer stacked bodies SL respectively. Namely, it is preferable that each of the plurality of active layers EL includes the multilayer stacked body SL, the n-side barrier layer BN, the well layer WL and the p-side barrier layer BP. As a result, the characteristics of the active layer EL can be made more uniform. As a result, further higher light emission efficiency can be obtained.

As already explained, in the embodiment, the thickness of the n-side barrier layer BN and the thickness of the p-side barrier layer BP are set thicker than 3 nm. When the thickness of these layers is 3 nm or less, the well layer WL and the adjoining multilayer stacked body SL would function as a coupled quantum well. This in turn causes unintended changes in wavelength, or reduces the effect of carrier confinement. As a result, the internal quantum efficiency would be lowered, and the light emission efficiency would also be lowered. On the other hand, by setting the thickness of these layers thicker than 3 nm, further light emission efficiency can be obtained.

Then, the thickness of the n-side barrier layer BN and the thickness of the p-side barrier layer BP are respectively set thinner than 10 nm. When the thickness of the n-side barrier layer BN and the thickness of the p-side barrier layer BP are set 10 nm or thicker, the effect from accumulated strain becomes smaller, and a reduction in light emission efficiency is liable to occur. On the other hand, by setting this thickness thinner than 10 nm, it is possible to obtain further light emission efficiency.

Additionally, the thickness of each layer included in the optical semiconductor device can be obtained, for example, by analyzing a transmission electron microscope image.

The effect of the embodiment is prominent particularly in the case where the well layer WL has a high In concentration and has a large strain.

The peak wavelength of the light emitted from the functional part 30 is, for example, in a range of not less than 500 nm and not more than 650 nm. In this case, the effect of making the characteristics of the plurality of well layers WL uniform is prominent. In this case, it is preferable that the number of the plurality of active layers be set in a range of not less than three and not more than ten. Herewith, further higher efficiency can be obtained.

In the embodiment, the peak wavelength of the light emitted from the functional part 30 can be set longer than 410 nm and shorter than 500 nm. In this case, the effect of making the characteristics of the plurality of well layers WL uniform is prominent. In this case, it is preferable that the number of active layers EL be set to four or larger. Herewith, further higher efficiency can be realized.

Each semiconductor layer in the optical semiconductor device 110 according the embodiment may be grown using a growth method such as Metal-Organic Chemical Vapor Deposition (MOCVD), Metal-Organic Vapor Phase Epitaxy (MOVPE) or the like.

When forming each semiconductor layer, the following materials may be used for raw materials.

For a Ga raw material, for example, TMGa (trimethylgallium), TEGa (triethylgallium) or the like may be used. For an In raw material, for example, TMIn (trimethylindium), TEIn (triethylindium) or the like may be used. For an Al raw material, for example, TMAl (trimethylaluminum) or the like may be used. For an N raw material, for example, $NH_3$ (ammonia), MMHy (monomethyl hydrazine), DMHy (dimethyl hydrazine) or the like may be used. For a Si raw material, $SiH_4$ (monosilane) or the like may be used. For an Mg raw material, for example, $Cp_2Mg$ (bis(cyclopentadienyl)magnesium) or the like may be used.

As explained already, the optical semiconductor device according to the embodiment is applied also to the detector device. The semiconductor detector device according to the embodiment is enabled to perform high sensitivity optical detection by improving the efficiency.

According to the embodiment, an optical semiconductor device of high efficiency can be obtained.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements included unintentionally In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components included in optical semiconductor devices such as, n-type semiconductor layers, p-type semiconductor layers, active layers, and electrodes, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all optical semiconductor devices practicable by an appropriate design modification by one skilled in the art based on the optical semiconductor devices described above as embodiments of the invention also are within the scope of the invention to the extent that the purport of the embodiments of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An optical semiconductor device, comprising:
    an n-type semiconductor layer;
    a p-type semiconductor layer; and
    a functional part provided between the n-type semiconductor layer and the p-type semiconductor layer,
    the functional part including a plurality of active layers stacked in a direction from the n-type semiconductor layer toward the p-type semiconductor layer, and
    each of at least two of the active layers including:
        a multilayer stacked body including a plurality of thick film layers and a plurality of thin film layers alternately stacked in the direction, a thickness of the thin film layers being not more than a thickness of the thick film layers,
        an n-side barrier layer provided between the multilayer stacked body and the p-type semiconductor layer,
        a well layer; and
        a p-side barrier layer provided between the well layer and the p-type semiconductor layer,
        wherein the well layer is provided between the n-side barrier layer and the p-side barrier layer.

2. The device according to claim 1, wherein a thickness of the n-side barrier layer and a thickness of the p-side barrier layer are thicker than 3 nanometers.

3. The device according to claim 1, wherein a peak wavelength of light emitted from the functional part is longer than 410 nanometers.

4. The device according to claim 1, wherein the well layer includes $In_xGa_{1-x}N$ ($0.12 \leq x \leq 1$).

5. The device according to claim 1, wherein a thickness of the thick film layers is thinner than a thickness of the n-side barrier layer and a thickness of the p-side barrier layer.

6. The device according to claim 1, wherein the n-side barrier layer and the p-side barrier layer include GaN.

7. The device according to claim 1, wherein a thickness of the n-side barrier layer and a thickness of the p-side barrier layer are thinner than 10 nanometers.

8. The device according to claim 1, wherein the n-type semiconductor layer, the p-type semiconductor layer and the functional part include a nitride semiconductor.

9. The device according to claim 1, wherein a concentration of In contained in the well layer is higher than a concentration of In contained in the n-side barrier layer and the p-side barrier layer.

10. The device according to claim 1, wherein a thickness of the thick film layers is not less than 1.0 nanometer and not more than 3 nanometers, and a thickness of the thin film layers is less than 1.5 nanometers.

11. The device according to claim 1, wherein the thick film layers include GaN, the thin film layers include InGaN.

12. The device according to claim 1, wherein a number of the active layers is more than 4.

13. The device according to claim 1, wherein each of the active layers includes the multilayer stacked body, the n-side barrier layer, the well layer and the p-side barrier layer.

14. The device according to claim 1, wherein a number of the thin film layers is more than 4.

15. The device according to claim 1, wherein a fluorescence image obtained by observing light emitted from the functional part in the direction have anisotropic patterns of light intensity.

16. The device according to claim 1, wherein a peak wavelength of light emitted from the functional part is not less than 410 nanometers and less than 500 nanometers, and a number of the active layers is more than 4.

17. The device according to claim 1, wherein a peak wavelength of light emitted from the functional part is not less than 500 nanometers and not more than 650 nanometers, and a number of the active layers is not less than 3 and not more than 10.

18. The device according to claim 1, wherein in one of the active layers,
    the n-side barrier layer contacts the multilayer stacked body,
    the well layer contacts the n-side barrier layer, and
    the p-side barrier layer contacts the well layer.

19. The device according to claim 1, wherein a bandgap energy in a bulk structure having a composition of the thin film layers is smaller than a bandgap energy in a bulk structure having a composition of the thick film layers.

20. The device according to claim 1, wherein a band gap energy of the well layer is smaller than a bandgap energy of the n-side barrier layer, and is smaller than a bandgap energy of the p-side barrier layer.

* * * * *